United States Patent
Schmidt et al.

(10) Patent No.: US 11,575,167 B2
(45) Date of Patent: Feb. 7, 2023

(54) HEATSINK CONFIGURATION AND ARRANGMENT FOR INVERTER AND SYSTEMS, COMPONENTS, AND METHODS THEREOF

(71) Applicant: Caterpillar Inc., Peoria, IL (US)

(72) Inventors: Paul T. Schmidt, Washington, IL (US); Keith E. Dixler, Peoria, IL (US); Jeffrey J. Speichinger, Peoria, IL (US); Joseph M Huelsmann, Washington, IL (US); Kyle A. Halfacre, Chillicothe, IL (US)

(73) Assignee: Caterpillar Inc., Peoria, IL (US)

( * ) Notice: Subject to any disclaimer, the term of this patent is extended or adjusted under 35 U.S.C. 154(b) by 132 days.

(21) Appl. No.: 17/121,764

(22) Filed: Dec. 15, 2020

(65) Prior Publication Data
US 2022/0190407 A1 Jun. 16, 2022

(51) Int. Cl.
*H01M 10/667* (2014.01)
*H01M 10/6556* (2014.01)
*H01M 10/6567* (2014.01)

(52) U.S. Cl.
CPC ..... *H01M 10/667* (2015.04); *H01M 10/6556* (2015.04); *H01M 10/6567* (2015.04)

(58) Field of Classification Search
CPC ......... H01M 10/6556; H01M 10/6567; H01M 10/667; Y02E 60/10
See application file for complete search history.

(56) References Cited

U.S. PATENT DOCUMENTS

| | | | |
|---|---|---|---|
| 5,631,821 A | 5/1997 | Muso | |
| 7,983,044 B2 | 7/2011 | Nakamura et al. | |
| 9,279,625 B2 | 3/2016 | Nakanishi et al. | |
| 10,278,305 B2 | 4/2019 | Roan et al. | |
| 10,291,145 B2 | 5/2019 | Friedlund et al. | |
| 2016/0353609 A1* | 12/2016 | Kakizaki | H01G 11/10 |

FOREIGN PATENT DOCUMENTS

| | | |
|---|---|---|
| EP | 3051931 A1 | 8/2016 |
| WO | 2017/081255 A1 | 5/2017 |

* cited by examiner

*Primary Examiner* — Lingwen R Zeng
(74) *Attorney, Agent, or Firm* — Xsensus, LLP

(57) ABSTRACT

A heatsink or heat exchanger for one or more power modules of an inverter or a converter comprises a coolant flow channel, comprised of a plurality of coolant flow channel portions that form a switchback or serpentine flow path, and that is adapted to circulate coolant inside the heat exchanger or heatsink. One or more vents can be provided inside the heat exchanger or heatsink to pass air from one coolant flow channel portion to an adjacent coolant flow channel portion.

9 Claims, 11 Drawing Sheets

HEATSINK CONFIGURATION AND ARRANGMENT FOR INVERTER AND SYSTEMS, COMPONENTS, AND METHODS THEREOF

TECHNICAL FIELD

The present disclosure relates to heatsinks for electrical systems, and more particularly to heatsink configurations and/or orientations as well as systems, components, and methods thereof.

BACKGROUND

Conventional heatsinks with serpentine fluid flow paths may preclude the potential to mount the heatsink in a vertical orientation because of the possibility of experiencing air entrapment. Such air entrapment can be detrimental to the performance of the heatsink during operation and/or to coolant fill and drain requirements. For instance, entrapped air in the heatsink may prevent the heatsink from being suitably filled to a desired amount (e.g., full, within a certain time limit, etc.), may require priming or 'burping' as part of the filling process, and/or can lead to hotspots. The presence of hotspots can result in underperformance or even damage to power modules that may be provided on the heatsink.

Patent Publication WO 2017081255 ("the WO '255 Patent Publication") describes an assembly forming a housing for an electrical apparatus. The WO '255 Patent Publication describes a cooling circuit configured to receive a fluid intended for cooling the electrical apparatus, where the cooling circuit is made up at least in part of a first wall of a first housing and a second wall of a second housing resting against one another. According to the WO '255 Patent Publication, the first wall and the second wall respectively include at least one groove, where the groove of the first wall and the groove of the second wall are intended for being placed so as to face one another in order to form the cooling circuit at least in part.

SUMMARY

According to an aspect a heat exchanger for a plurality of inverter power modules is disclosed or provided. The heat exchanger can be adapted to be vertically oriented in a length direction during operation thereof. The heat exchanger can comprise a single-path coolant flow channel, comprised of a plurality of coolant flow channel portions that form a switchback flow path, adapted to circulate coolant in the heat exchanger; a coolant input port at a start of the single-path coolant flow channel; and a coolant output port at an end of the single-path coolant flow channel. At least one first air vent can be provided at a first end portion of a body of the heat exchanger between a first set of adjacent coolant flow channel portions. At least one second air vent can be provided at a second end portion of the body of the heat exchanger between a second set of adjacent coolant flow channel portions.

In another aspect, a method regarding a heatsink is disclosed or implemented. The method can comprise providing a heatsink adapted to extend through an inner volume of a cage assembly of an inverter assembly, the heatsink having a planar body; and orienting the heatsink to extend upright in a vertical direction. The planar body of the heatsink can define an internal coolant flow channel, comprised of a plurality of coolant flow channel portions that form a serpentine flow path, adapted to circulate liquid coolant from a coolant input of the heatsink to a coolant output of the heatsink. A first vent opening can be provided at a first end portion of the heatsink in a first channel wall separating adjacent coolant flow channel portions, and a second vent opening can be provided at a second end portion of the heatsink in a second channel wall separating adjacent coolant flow channel portions. Each of the first and second vent openings can be adapted to pass air and a second portion of the liquid coolant from a first one of the adjacent coolant flow channel portions to a subsequent one of the adjacent coolant flow channel portions in the serpentine flow path when a first portion of the liquid coolant greater than the second portion is moving within the first adjacent coolant flow channel portion and the second adjacent coolant flow channel portion according to the serpentine flow path.

And in another aspect an inverter assembly for a power system is disclosed or provided. The inverter assembly can comprise a cage assembly formed of at least two cages fixed to each other side-by-side in a row so as to define a first end of the cage assembly and a second end of the cage assembly opposite the first end; and a heatsink, having a planar body, extending transversely through an inner volume of each of the at least two cages, from at least the first end of the cage assembly to at least the second end of the cage assembly. The cage assembly and the planar body of the heatsink can be oriented vertically such that the cage assembly extends vertically from the first end to the second end thereof. The planar body of the heatsink can define an internal coolant flow path adapted to pass coolant received from an inlet port of the heatsink to an outlet port of the heatsink during operation of the heatsink. The coolant flow path can be arranged in a serpentine pattern from the inlet port to the outlet port and can be formed by a plurality of flow channel portions. One or more vent openings can provided along the coolant flow path at a first end portion of the heatsink and one or more vent openings can be provided along the coolant flow path at a second end portion of the heatsink opposite the first end portion. Each of the vent openings can be adapted to pass air and a predetermined amount of the coolant from one flow channel portion to an adjacent flow channel portion of the plurality of flow channel portions.

Other features and aspects of this disclosure will be apparent from the following description and the accompanying drawings.

DETAILED DESCRIPTION

The present disclosure relates to heatsinks for electrical components, and more particularly to heatsink configurations and/or orientations for electrical inverters (including converters), as well as systems, components, and methods thereof.

Figure 1:
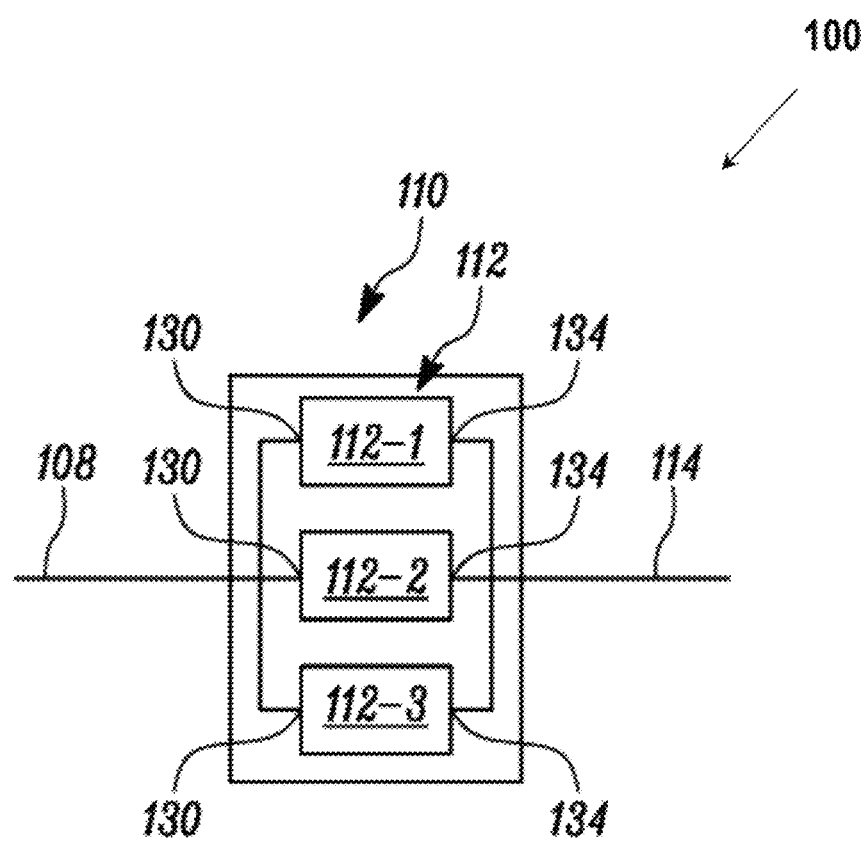
FIG. 1 is a block diagram of a power system according to one or more embodiments of the disclosed subject matter.
Figure 2A:
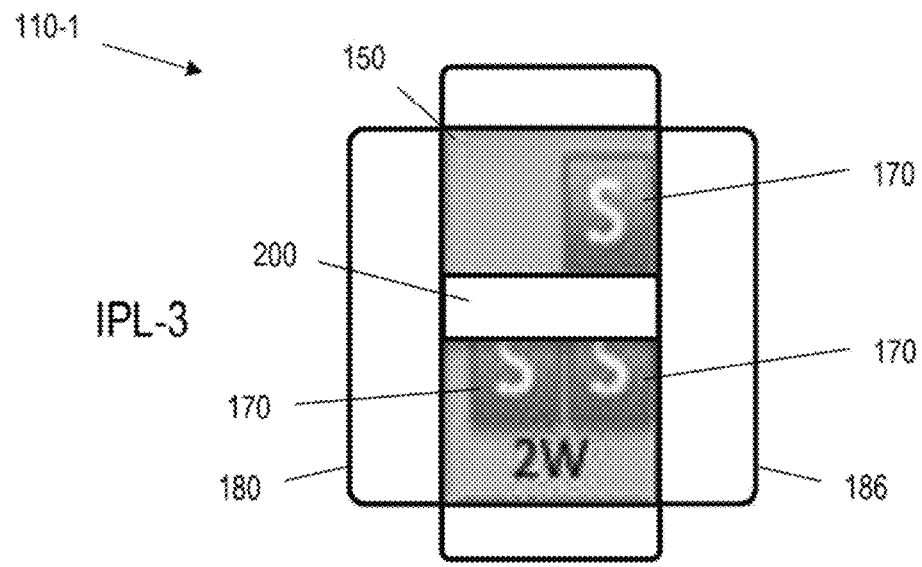
FIGS. 2A-2H show exemplary modular inverter assemblies or arrangements according to embodiments of the disclosed subject matter.
Figure 2B:
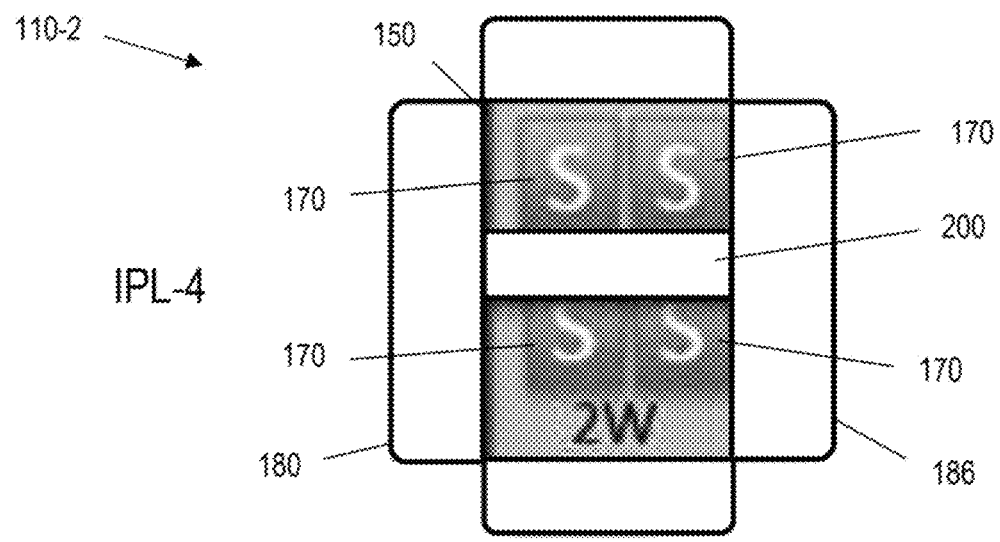
Figure 2C:
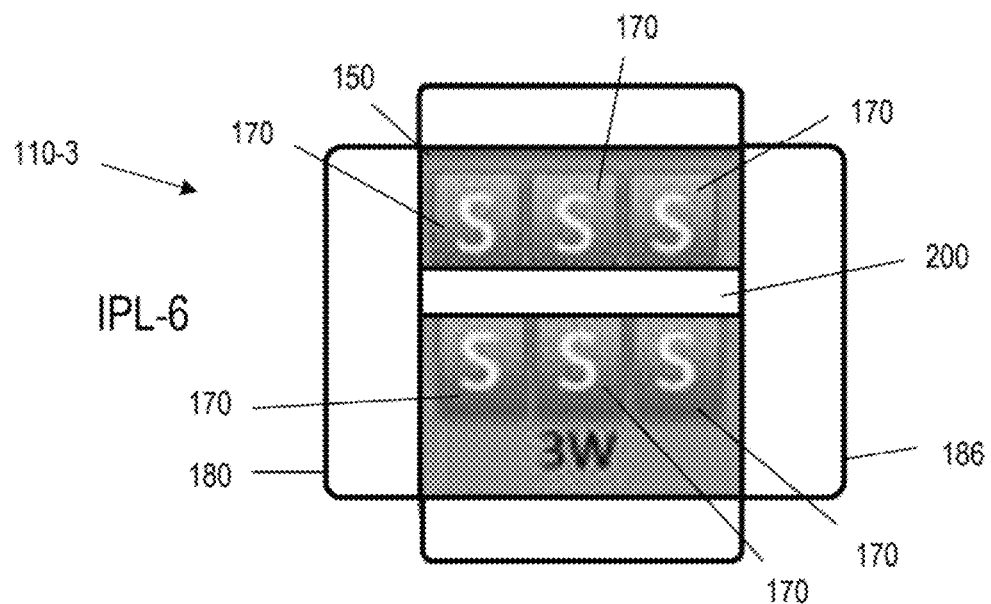
Figure 2D:
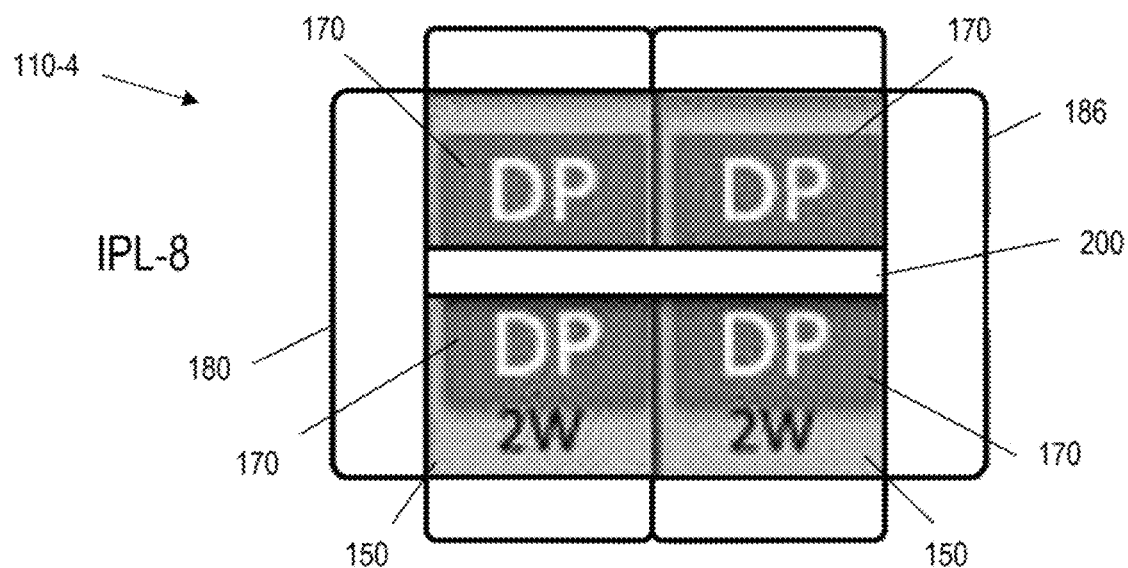
Figure 2E:
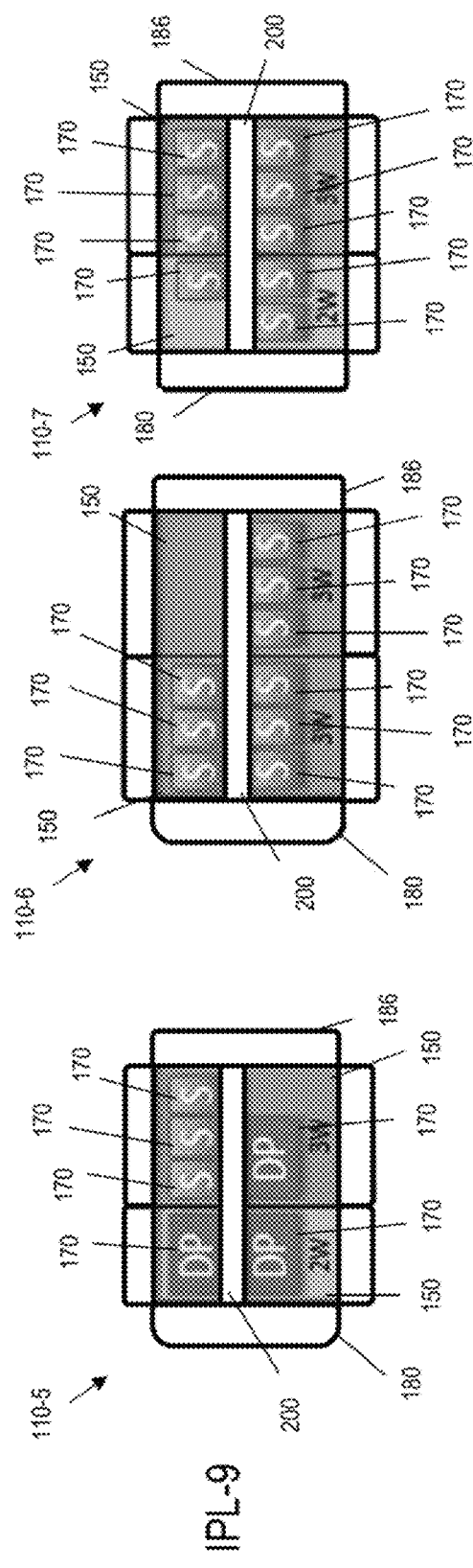
Figure 2F:
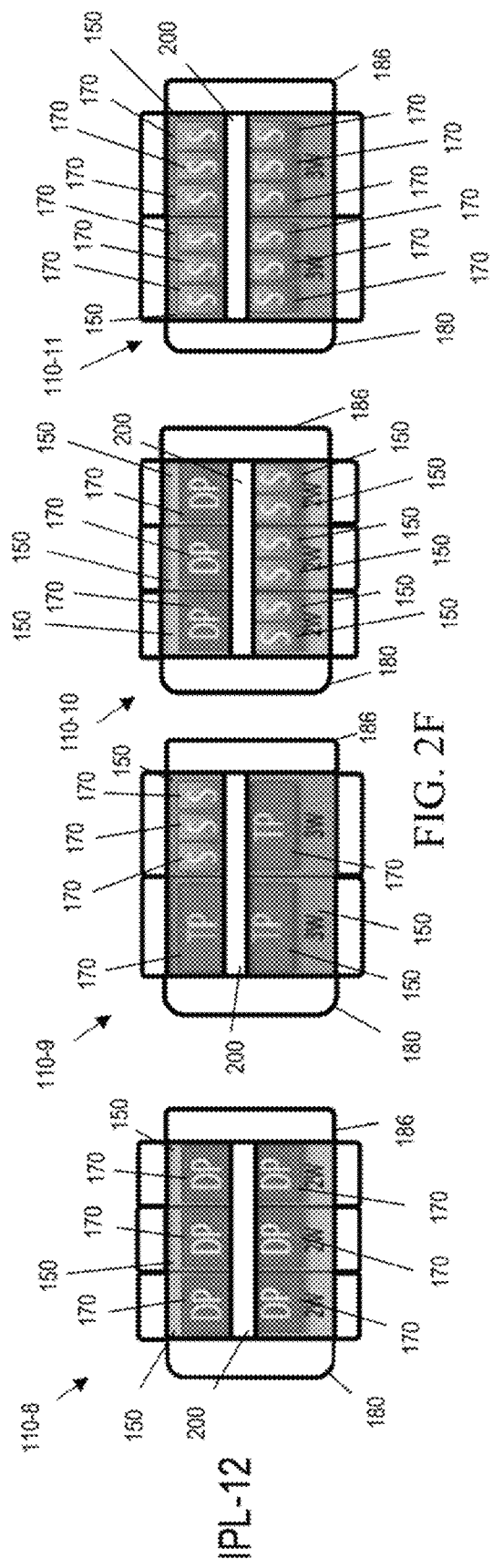
Figure 2G:
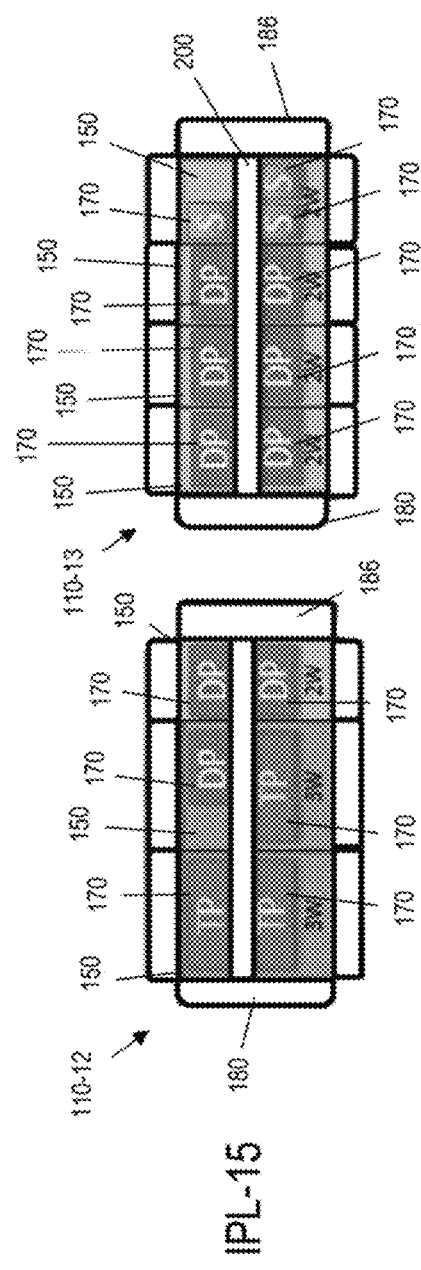
Figure 2H:
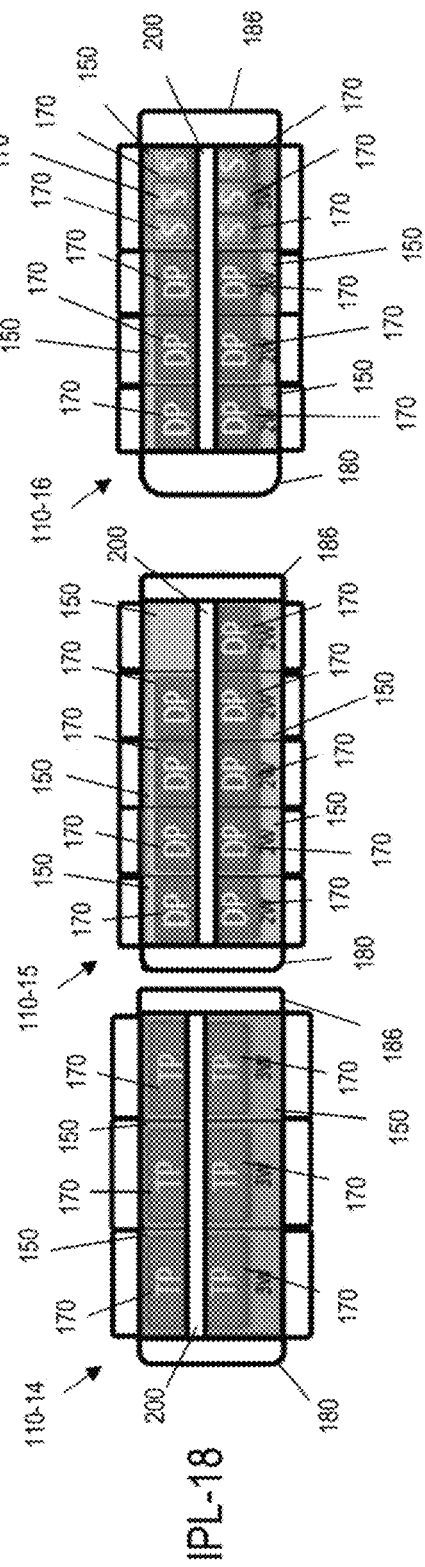

FIG. 1 illustrates a block diagram of a power system 100 according to one or more embodiments of the present disclosure. Generally, the power system 100 may be a power system having one or more inputs to receive AC or DC voltage and one or more outputs to output AC or DC voltage. The voltage provided to the inputs of the power system 100 may be single-phase or multi-phase. Likewise, the voltage output from the power system 100 may be single-phase or multi-phase. Multi-phase can include two-phase, three-phase, and four-phase, as examples.

The voltage input to the power system 100 can be provided from one or more power sources such as an electric generator (e.g., a three-phase electric generator), for instance, powered by an internal combustion engine, a battery (or batteries), a fuel cell (or cells), an electrical grid, etc. The voltage output from the power system 100 can be provided to one or more electrical loads such as one or more electric motors (e.g., a three-phase electric motor).

According to one or more embodiments, the power system 100 may be implemented in a machine. The machine may be characterized as a working machine and may be employed to perform various operations such as mining operations, construction operations, farming operations, transportation operations, forestry operations, material handling operations, etc. Optionally, the power system 100 may be supported on a frame of the machine. Examples of working machines include tractors, loaders, bulldozers, etc., though embodiments of the disclosed subject matter are not limited to working machines or those expressly listed.

Referring still to FIG. 1, the power system 100 can include an inverter arrangement or assembly 110. Generally, the voltage input(s) to the inverter arrangement 110 can be provided via a first power link 108 and the voltage output(s) from the inverter arrangement 110 can be provided via a second power link 114. The first power link 108 can be representative of one or more electrically conductive paths (e.g., wiring) from one or more corresponding power sources. Likewise, the second power link 114 can be representative of one or more electrically conductive paths (e.g., wiring) to one or more corresponding electrical loads.

As illustrated in FIG. 1, the inverter arrangement 110 may include a plurality of inverter units 112, individually referred to as a first inverter unit 112-1, a second inverter unit 112-2, and a third inverter unit 112-3. Embodiments of the disclosed subject matter, however, are not limited to the first, second, and third inverter units 112-1-112-3, and may include a different number of inverter units, such as less than three (e.g., only one, only two) or more than three inverter units 112 (e.g., three per phase per load). Indeed, as described herein, the inverter arrangement 110, in accordance with embodiments of the disclosed subject matter, can be configured with a suitable number of inverter units 112 to meet the specific power requirements of the particular power system 100 in which the inverter arrangement 110 is provided.

Generally, in a case where AC voltage is provided as an input to an input terminal 130 of the inverter unit 112, the inverter unit 112 may process the AC input signal to generate a suitable signal or signals for output from an output terminal 134 of the inverter unit 112. For instance, the inverter unit 112 may convert the AC input voltage into an intermediate DC value, for instance, via a rectifier, followed by further processing (e.g., pulse width modulation) to generate the suitable signal(s), such as Pulse Width Modulated (PWM) signals, for the particular electrical load. As another example, in a case where DC voltage is provided as an input to the input terminal 130, the inverter unit 112 may be driven as a so-called converter to convert the DC voltage to a suitable signal or signals for the particular electrical load (e.g., PWM signal(s)) for output via the output terminal 134 and to the second power link 114. Thus, in some embodiments, the output of the inverter unit 112 can be an AC voltage signal or signals, as noted above.

On the other hand, embodiments of the disclosed subject matter are not limited to only receiving voltage via the first power link 108 and input terminal(s) 130 of the inverter unit(s) 112 and only outputting voltage via the second power link 114 and output terminal(s) 134 of the inverter unit(s) 112. Rather, according to one or more embodiments, the second power link 114 can provide voltage signals as input to the inverter arrangement 110 and the inverter arrangement 110 can output voltage signals as output to the first power link 108.

Discussed in more detail below, each inverter unit 112 can be comprised of one or more power modules. In turn, each of the power modules may be comprised of one or more power switching devices, such as semiconductor power switching devices (e.g., Insulated Gate Bipolar Transistors (IGBTs), Metal Oxide Semiconductor Field Effect Transistors (MOSFETs), etc.). For example, each power module can be comprised of or consist of one or more pairs of semiconductor power switching devices (e.g., one or more pairs of IGBTs).

Turning to FIGS. 2A-2H, these figures show examples of modular inverter assemblies or arrangements 110 according to embodiments of the disclosed subject matter. The exemplary inverter assemblies in FIGS. 2A-2H are respectively referred to as inverter assemblies 110-1, 110-2, 110-3, 110-4, 110-5, 110-6, 110-7, 110-8, 110-9, 110-10, 110-11, 110-12, 110-13, 110-14, 110-15, and 110-16. However, embodiments of the disclosed subject matter are not limited to the examples shown in FIGS. 2A-2H.

FIGS. 2A-2H show that inverter assemblies 110 according to embodiments of the disclosed subject matter can be modular in nature and configurable on a block-by-block or cage-by-cage approach in terms of size based on power demands for a particular application. Particular application, in this context, can mean power load requirements of a particular machine, such as a working machine as described above. More specifically, the configuration of the power module(s) can be based on the specific electrical load(s) and input(s) to which the power module(s) is connected.

Inverter assemblies 110, such as those shown in FIGS. 2A-2H, can include one or more cages or blocks 150 and corresponding one or more power modules 170. Though FIGS. 2A-2H show inverter assemblies 110 with one, two, three, four, and five cages 150, embodiments of the disclosed subject matter are not so limited. That is, inverter assemblies 110 according to embodiments of the disclosed subject matter may have more than five cages 150. Each of the cages 150 can be made of aluminum and/or may be formed via casting (e.g., sand casting), for instance, as a single or unity piece (i.e., a one-piece cage). An arrangement of one or more cages 150, such as shown in FIGS. 2A-2H, may be referred to herein as a cage assembly.

Each power module 170 can be characterized as single parallel (S), double parallel (DP), or triple parallel (TP), where single parallel S will hereinafter be referred to as single parallel (SP). In this regard, single parallel SP can mean one switching device (e.g., IGBT) per phase, double parallel DP can mean two switching devices (e.g., IGBTs) per phase, and triple parallel TP can mean three switching devices (e.g., IGBTs) per phase.

FIGS. 2A-2H show the inverter assemblies 110 grouped according to number of power modules 170. In particular, IPL-3 can refer to three power modules 170 per inverter assembly 110, IPL-4 can refer to four power modules 170 per inverter assembly 110, IPL-6 can refer to six power modules 170 per inverter assembly 110, IPL-8 can refer to eight power modules 170 per inverter assembly 110, IPL-9 can refer to nine power modules 170 per inverter assembly 110, IPL-12 can refer to twelve power modules 170 per inverter assembly 110, IPL-15 can refer to fifteen power modules 170 per inverter assembly 110, and IPL-18 can refer to eighteen power modules 170 per inverter assembly 110.

Discussed in more detail below, each inverter assembly 110 can also have a first end cap or plate 180, a second end cap or plate 186, and a heatsink 200. Optionally, the first end plate 180 and/or the second end plate 186 may be considered part of the heatsink 200. Also discussed in more detail below, each inverter assembly 110 can have one or more power connection interface panels, one or more panel arrangements, and one or more capacitors associated with each cage 150. Optionally, such capacitor(s) can be considered part of the inverter assembly 110.

As shown in FIGS. 2A-2H, the heatsink 200 can extend through (e.g., transversely) all of the cages 150 of the inverter assembly 110. Furthermore, the heatsink 200 may extend to opposite ends of a single cage 150 in the case of a single-cage 150 cage assembly embodiment or to opposite ends of a multiple-cage 150 cage assembly embodiment. According to one or more embodiments, the heatsink 200 can extend to the first end plate 180 and/or the second end plate 186. Optionally, opposite ends of the heatsink 200 can be mechanically fixed to the first end plate 180 and/or the second end plate 186. Also shown in FIGS. 2A-2H, each power module 170 can be provided on the heatsink 200. For instance, each power module 170 can be mechanically coupled or fixed to the heatsink 200 via one or more fasteners, adhesives, etc., including combinations.

According to one or more embodiments, the inverter assembly 110 can be sealed to prevent or minimize external substances such as water and/or dust from entering an internal volume or space of the inverter assembly 110. That is, all external surfaces of the inverter assembly 110 can be sealed to the external environment. Such sealing can be according to IP67, as an example, to prevent water and/or dust from gaining access to the inside of the inverter assembly 110. Regarding sealing, the first end plate 180, the second end plate 186, the plurality of power connection interface panels, and the one or more capacitors can be sealingly connected to their respective cage(s) 150 via one or more fasteners, adhesives, O-rings, gaskets, etc., including combinations.

Turning back to the modular and configurable aspect of inverter assemblies 110 according to embodiments of the disclosed subject matter, as illustrated in FIGS. 2A-2H, each cage 150 can receive and house one or more power modules 170 of the same type (e.g., all SPs, all DPs, or all TPs) or of different types (e.g., SPs and DPs, SPs and TPs, etc.). Additionally, according to one or more embodiments, the cages 150 can come in different sizes, for instance, a so-called double-size cage and a so-called triple-size cage. Double-size and triple-size in this context can mean the overall maximum number of power parallel configurations for the power modules 170 in a width direction of the cage 150. For instance, for a double-size cage 150 a maximum of either two adjacent SP power modules 170 or a single DP power module 170 can be implemented in the width direction of the cage 150 (for each of the opposing mounting surfaces of the heatsink 200). A TP power module 170 may not be implemented in the double-size cage 150 according to embodiments of the disclosed subject matter. Thus, the internal volumes defined by the cages 150 can be different. For instance, the width of double-size cage 150 can be less than the width of the triple-size cage 150 (optionally, the length and/or height of the double-size and triple-size cages 150 can be the same). Though double- and triple-size cages 150 are discussed above, embodiments of the disclosed subject matter can involve more than these two sizes of cages 150.

The size and number of the cage(s) 150 and the type and number of the power modules 170 per cage 150 can be selected for a particular configuration for the inverter assembly 110 according to the power requirements for the particular electrical load or loads, as noted above.

As illustrated in FIGS. 2A-2H, inverter assemblies 110 accord to embodiments of the disclosed subject matter can include a single cage 150 (e.g., a single triple-size cage or a single double-size cage), multiple cages 150 of the same size (e.g., all double-size or all triple-size cages), or multiple cages 150 where at least one of the cages 150 is of a different size (e.g., one double-size cage and one triple-size cage). Also shown in FIGS. 2A-2H, the inverter assemblies can provide numerous options for power arrangements, including the following power arrangements: 2 over 1, 2 over 2, 3 over 3, 4 over 4, 5 over 4, 6 over 3, 6 over 6, 8 over 7, 9 over 9, or 10 over 8. Embodiments of the disclosed subject matter, however, are not limited to the foregoing exemplary power arrangements. Each of the inverter assemblies 110-1, 110-2, 110-3, 110-4, 110-5, 110-6, 110-7, 110-8, 110-9, 110-10, 110-11, 110-12, 110-13, 110-14, 110-15, and 110-16 can be mounted or otherwise provided according to a horizontal orientation or a vertical orientation. In the horizontal orientation and the vertical orientation, the length of the cage assembly can run horizontally or vertically, respectively. As an example, the inverter assemblies 110 can be mounted vertically on a working machine.

Figure 3:
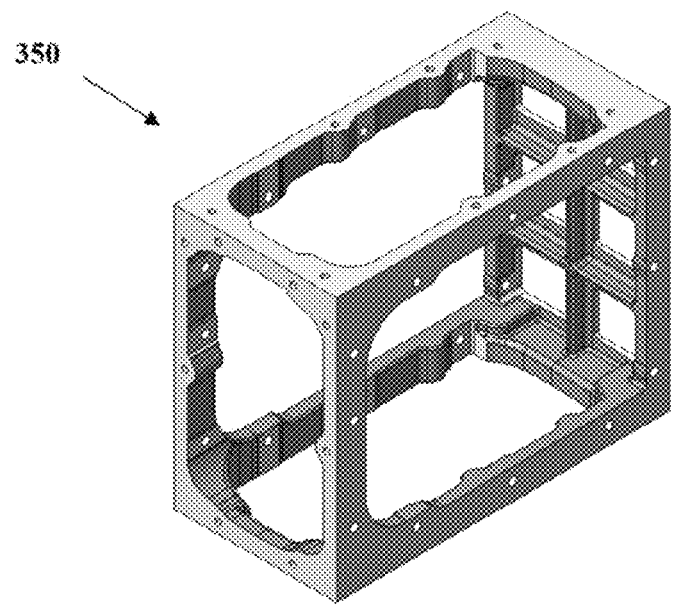
FIG. 3 is a perspective view of an individual cage or block of a cage arrangement according to one or more embodiments of the disclosed subject matter.

Turning now to FIG. 3, FIG. 3 shows a block or cage 350 according to embodiments of the disclosed subject matter. Cage 350 may correspond to at least some of the cages 150 discussed above. Here, the cage 350 can be representative a double-size cage, such as described above. Cages 150 according to embodiments of the disclosed subject matter can be in the form of a hollow geometric frame, for instance, a cuboid. For example, the cage 350 of FIG. 3 may be characterized as being in the form of a rectangular cuboid. Thus, cuboid, as used herein, can mean or include cube-shaped, substantially cube-shaped, rectangular-shaped, or substantially rectangular-shaped, at least for the outer profile of the cage 150.

Cage 350 can be in the form of a frame with at least one opening per side or face. In FIG. 3, cage 350 has one opening for each of the front, left, right, top, and bottom sides and a plurality of openings for the rear side (as defined according to the orientation of FIG. 3). As shown, the openings for each of the front, left, right, top, and bottom sides can be greater in cross sectional area than the cross-sectional area of each of the openings of the rear side. Optionally, the openings of the rear side can be the same size (shape and dimension) as each other.

Discussed in more detail below, the rear side of the cage 350 can be adapted to have mechanically coupled thereto (and optionally sealing coupled thereto) a plurality of capacitors, for instance, in one-to-one correspondence with the openings in the rear side, such that the capacitors extend from the rear side of the cage 350. The plurality of openings in the rear side of the cage 350 can allow for the electrical connection between terminals or leads of the capacitors and corresponding internal components of the cage 350, such as the power modules 170 and associated components (e.g., wiring, etc.). The lattice structure of the rear side, which can be formed by intersecting ribs, can be to provide structural integrity and rigidity for the cage 350. In this example, at least some of the windows or openings in the rear side of the cage 350 can be used to access mechanically affixed joints (e.g., mechanically bolted joint) for the coupling and/or decoupling of the cage 350 to another cage 150 (e.g., cage 350) and/or an end plate, such as first end plate 180 and/or second end plate 186.

Figure 4:
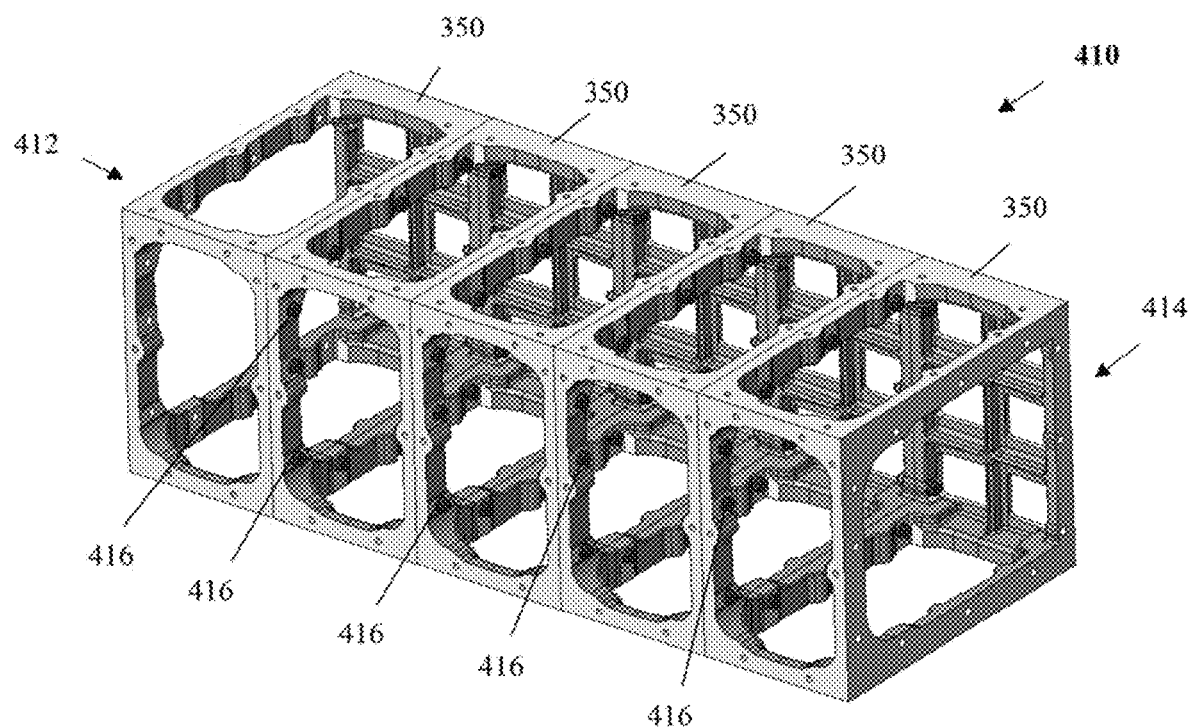
FIG. 4 is a perspective view of a cage assembly according to one or more embodiments of the disclosed subject matter.

Referring now to FIG. 4, this figure shows a cage assembly 410 according to embodiments of the disclosed subject matter. Notably, cage assembly 410 can be comprised of a plurality cages, in this case, five of the cages 350. In this example, the cages 350 can all have the same dimensions. Cage assembly 410 may be representative of an underlying cage assembly of the inverter assembly 110-15 of FIG. 2H. Incidentally, cages 150, such as cages 350, can be mechanically coupled together as shown in FIG. 4 prior to providing additional components or features therein or thereon, such as the heatsink 200, the power modules 170, the capacitors, the first end plate 180, the second end plate 186, etc.

As shown in FIG. 4, the cages 350 can be mechanically fixed to each other side-by-side in a row so as to define a first end 412 of the cage assembly 410 and a second end 414 of the cage assembly 410 opposite the first end 412. As noted above, adjacent cages 350 can be sealingly fixed to each other. That is, a seal can be provide between adjacent sides of adjacent cages 350. Also shown in FIG. 4, adjacent cages 350 can be mechanically fixed to each other via a plurality of fasteners 416. As an example, the fasteners 416 can be nut and bolt pairs (and optionally washers).

Some or all of the cages 350 can be arranged according to the same orientation (e.g., rear sides on same side of cage assembly 410). FIG. 4 also shows that the lengths of the cages 350 can run parallel to each other and a length of the cage assembly 410 can be perpendicular to the lengths of the cages 350.

Figure 5:
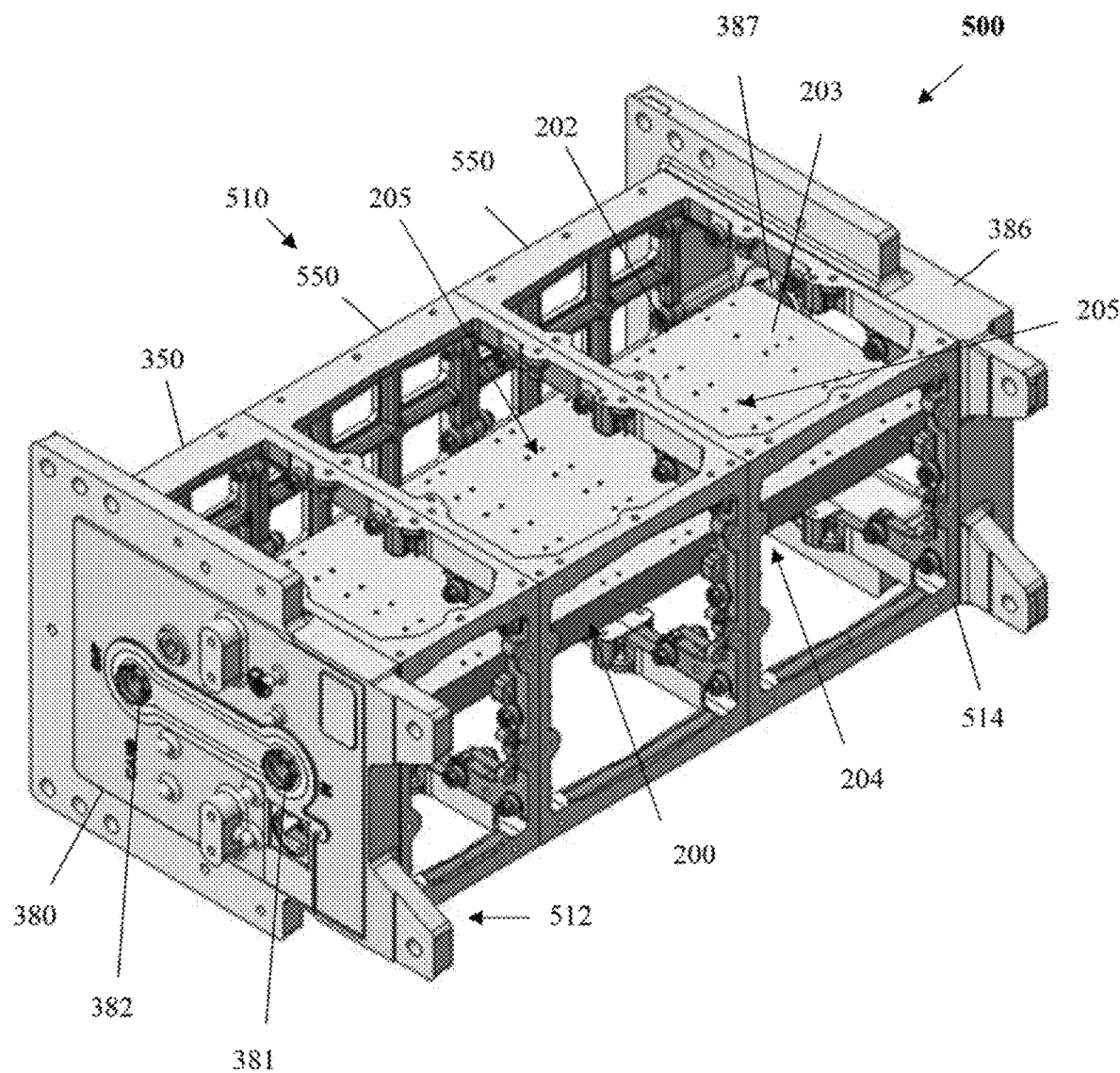
FIG. 5 is a perspective view of a portion of an inverter assembly or arrangement according to embodiments of the disclosed subject matter.

FIG. 5 shows an inverter assembly 500 with a variation of a cage assembly 510 according to embodiments of the disclosed subject matter. In this example, the cage assembly 510 can have cages of different sizes. For instance, cage assembly 510 can have one cage 350 and two cages 550 of same size mechanically fixed to each other side-by-side in a row so as to define a first end 512 of the cage assembly 510 and a second end 514 of the cage assembly 510 opposite the first end 512. Here, the cage 350 can be representative a double-size cage and the cages 550 can be representative of a triple-size cage, such as described above. Thus, the cage 350 and the cages 550 can have different widths but the same length and height. Cage assembly 510 may be representative of an underlying cage assembly of the inverter assembly 110-12 of FIG. 2G.

Also shown in FIG. 5, a first end cap or plate 380 can be mechanically coupled (and optionally sealingly coupled) to the first end 512 of the cage assembly 510 and a second end cap or plate 386 can be mechanically coupled (and optionally sealingly coupled) to the second end 514 of the cage assembly 510. First end plate 380 and second end plate 386 can respectively correspond to the first end plate 180 and the second end plate 186 discussed above. According to one or more embodiments, such end plates can be castings. Additionally, though the first end plate 380 and the second end plate 386 are expressly shown for cage assembly 510, such end plates can be similarly provided for cage assembly 410 of FIG. 4.

The first end plate 380 can have or otherwise present a plurality of coolant ports, particularly a coolant input port 381 and a coolant output port 382. Discussed in more detail below, some or all of the coolant input port 381 and/or the coolant output port 382 may be part of the heatsink 200. In this regard, the coolant input port 381 and/or the coolant output port 382 may merely extend through respective opening portions of the first end plate 380. Alternatively, the first end plate 380 may provide a coupling interface, such as a threaded, quick-connect, or snap-fit receptacle, for removably coupling coolant conduits (e.g., hoses) to the coolant input port 381 and the coolant output port 382. The second end plate 386 can have a coolant drain port 387 (and optional plug or valve). Similarly, some or all of the coolant drain port 387 may be part of the heatsink 200. In this regard, the coolant drain port 387 may merely extend through an opening of the second end plate 386. Alternatively, the second end plate 386 may provide a coupling interface, such as a threaded or snap-fit receptacle, for removably coupling a plug or cap over the coolant drain port 387. Optionally, the first end plate 380 and/or the second end plate 386 can have additional connections or ports, such as an MS electrical connector to perform diagnostics.

The heatsink 200 can extend through an inner volume of the cage assembly 510. More specifically, the heatsink 200 can extend transversely through inner volumes of the cage 350 and the cages 550, such as shown in FIG. 5. Moreover, the heatsink 200 can extend from the first end 512 of the cage assembly 510 to the second end 514 of the cage assembly 510. According to one or more embodiments, the heatsink 200 may extend outward past the first end 512 and/or the second end 514 of the cage assembly 510. In this regard, opposite ends of the heatsink 200 can be mechanically fixed to the first end plate 380 and/or the second end plate 386. The opposite ends of the heatsink 200 can be mechanically fixed to the first end plate 380 and/or the second end plate 386 via friction stir welding, for instance. According to one or more embodiments, the heatsink 200 may not be connected to or directly supported by the cage assembly 510. Rather, in such embodiments the first end plate 380 and/or the second end plate 386 can support the heatsink 200.

Additional components can be provided inside the cage assembly 510. Among other components, internal components of the cage assembly 510 can include one or more power modules 170 in each of cage 350, 550, power buses (e.g., AC busbars, DC busbars), circuit boards (e.g., gate drive PCB, interface PCB, high voltage PCB), wiring, transducers, temperature sensors, etc.

The heatsink 200 can include a body 202. In one or more embodiments, the body 202 can be made by extruding the body 202 from a material with suitable heat conducting properties, such as aluminum. As noted above, the first end plate 380 and/or the second end plate 386 can be mechanically fixed to the first end 512 and the second end 514, respectively, for instance, via welding. The welding can be friction stir welding (FSW) or other suitable welding techniques.

The body 202 of the heatsink 200 can be planar in shape. As shown in FIG. 5, a width of the body 202 can extend in a width direction of the cage assembly 510 and a thickness of the body 202 can extend in a height direction of the cage assembly 510. A length of the body 202 can extend in a length direction of the inverter assembly 500.

The body 202 of the heatsink 200 can have a first mounting surface 203 and a second mounting surface 204 opposite the first mounting surface 203. Each of the first mounting surface 203 and the second mounting surface 204 can include a plurality of mounting interfaces 205. One or more power modules 170 can be mounted to each of the first mounting surface 203 and/or the second mounting surface 204 as described herein. For instance, the mounting interfaces 205 can be holes or openings in the body 202 of the heatsink 200 adapted to receive mounting pins or the like of corresponding power modules 170. The first mounting surface 203 and the second mounting surface 204 can be disposed in heat transferring relationship with an underlying coolant flow passage or channel within the body of the heatsink 200. The first mounting surface 203 and the second mounting surface 204 can be cooled via conduction by coolant fluid circulating through the coolant flow channel as part of a cooling circuit of a coolant circulation system. Hence, the first mounting surface 203 and the second mounting surface 204 may be characterized or referred to as heat transfer faces or surfaces.

As noted above, the heatsink 200 can form all or some of the coolant input port 381, the coolant output port 382, and/or the coolant drain port 387. Generally, the coolant input port 381, the coolant output port 382, and the coolant drain port 387 can be configured to allow coolant (e.g., liquid coolant, such as liquid antifreeze) to pass to and from an internal coolant chamber of the heatsink 200 that defines the coolant flow channel. Incidentally, in operation, the coolant input port 381 and the coolant output port 382 can be connected to respective coolant conduits (e.g., hoses) and the coolant drain port 387 can be plugged. The coolant can be caused to circulate from the coolant input port 381 to and through the coolant flow channel in the body 202 of the heatsink 200 and then to the coolant output port 382 for output from the heatsink 200.

Figure 6:
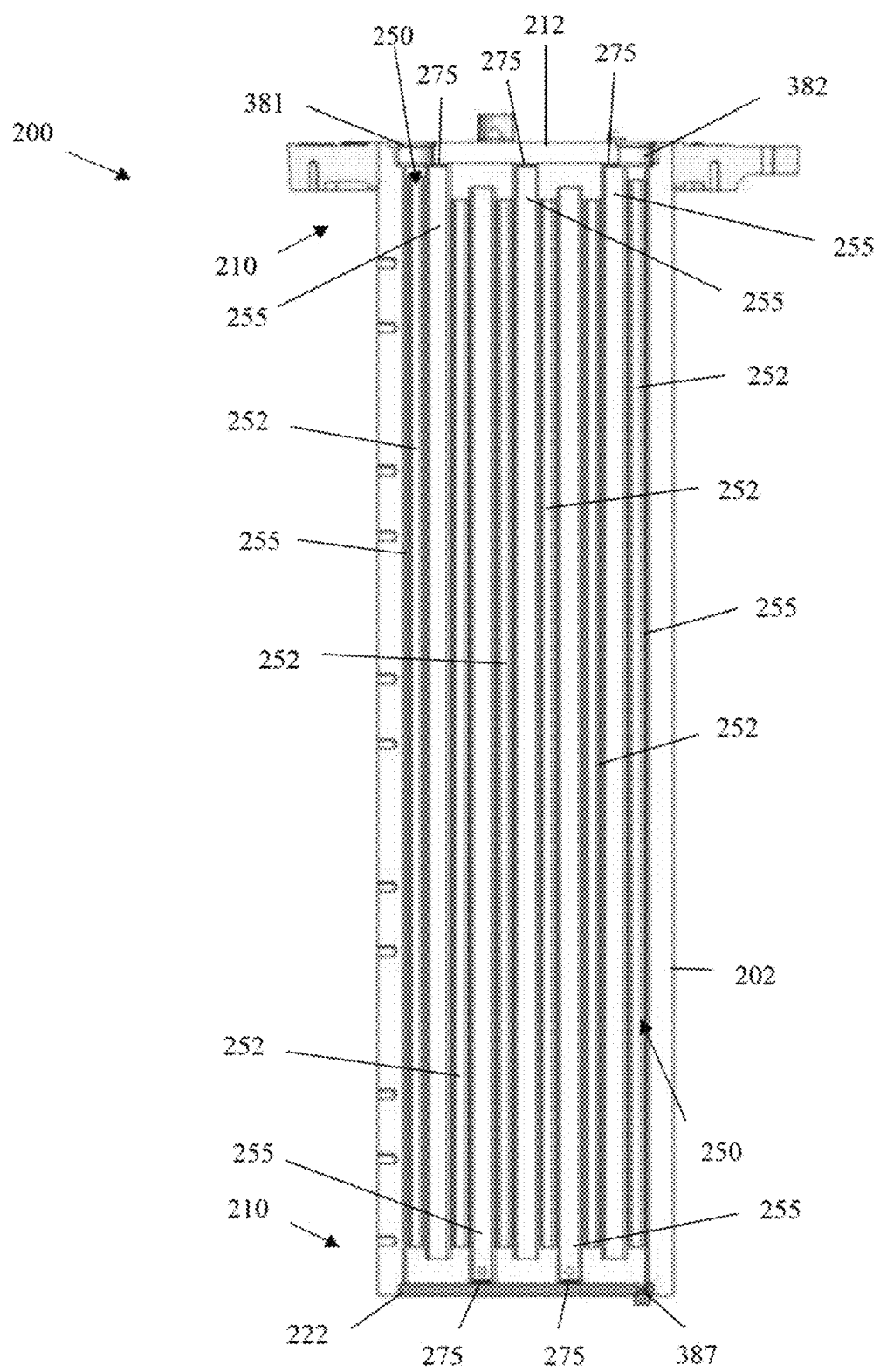
FIG. 6 is a cross-sectional view of a heatsink according to embodiments of the disclosed subject matter.
Figure 7:
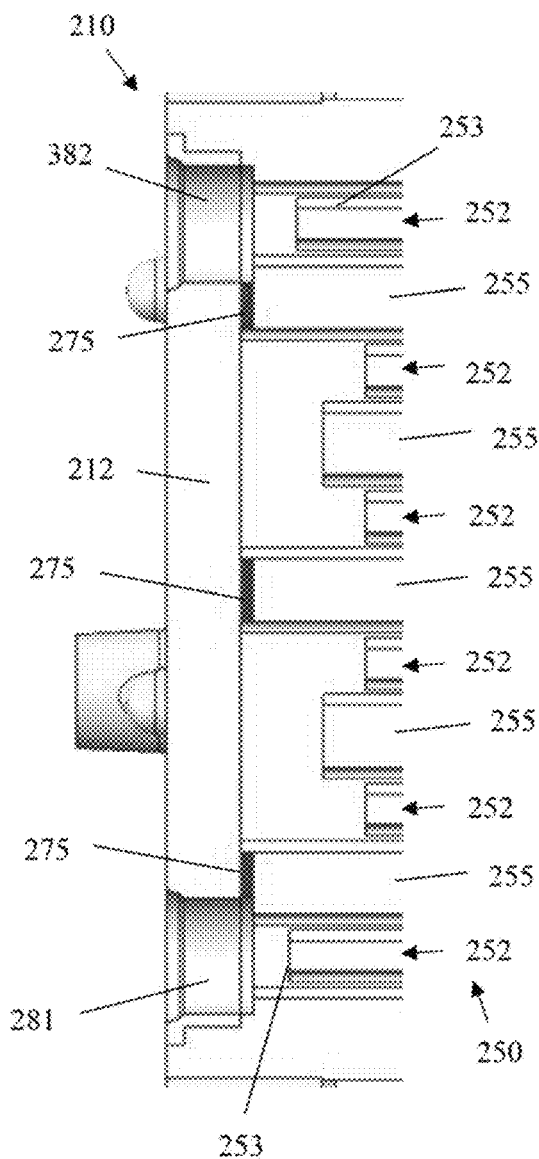
FIG. 7 is an enlarged view of the left side of the heatsink of FIG. 6.
Figure 8:
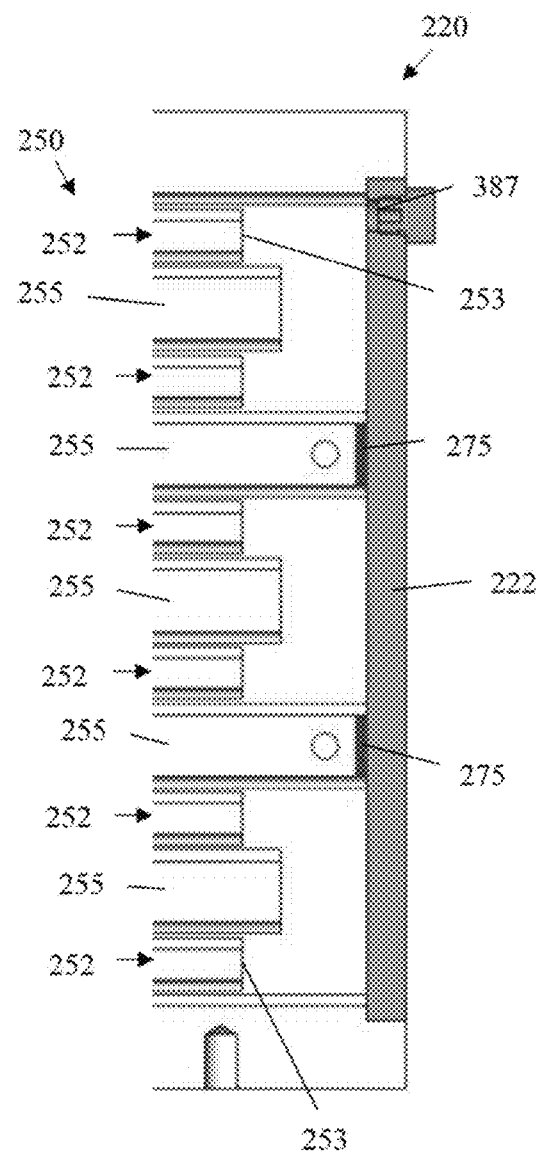
FIG. 8 is an enlarged view of the right side of the heatsink of FIG. 6.

FIG. 6 is a cross-sectional view of the heatsink 200, and FIG. 7 and FIG. 8 are enlarged views of the left side and the right side of the heatsink 200, respectively. The left side of the heatsink 200 shown in FIG. 7 may correspond to a first end portion 210 of the heatsink 200. Likewise, the right side of the heatsink 200 shown in FIG. 8 may correspond to a second end portion 220 of the heatsink 200.

As noted above, and as shown in FIGS. 6-8, the coolant input port 381 and the coolant output port 382 can be at the first end portion 210 of the heatsink 200, and the coolant drain port 387 can be at the second end portion 220 of the heatsink 200. More specifically, the coolant input port 381 and the coolant output port 382 can be provided in an end wall 212 of the heatsink 200, and the coolant drain port 387 can be provided in an end wall 222 of the heatsink 200. The end wall 212 may be referred to as a fitting end and the end wall 222 may be referred to as a return end. Optionally, the end wall 212 and/or the end wall 222 can be considered part of the body 202 of the heatsink 200, whether formed in one piece with the body 202 or a separate component of the heatsink 200. According to one or more embodiments, the body 202 of the heatsink 200, including the internal configuration thereof, can be formed via a long extrusion process, as noted above, and the end wall 212 and the end wall 222 can be fixed to opposite ends of the body 202 of the heatsink, for instance, via friction stir welding.

An internal coolant flow path can be defined inside the heatsink 200 by a coolant flow passage or channel 250. As shown in FIG. 6, the coolant flow channel 250 can be comprised of a plurality of flow channel portions 252. Flow channel turn portions of the coolant flow channel 250 may fluidly link adjacent flow channel portions 252 at the first end portion 210 and the second end portion 220 of the heatsink 200. In that the flow channel portions 252 can extend in a length direction of the heatsink 200, the flow channel portions 252 may be referred to as longitudinal coolant passage segments.

In some embodiments one or more of the flow channel portions 252 can have a divider 253. The divider 253, which may be in the form of a fin or the like, can partition coolant flow within the corresponding flow channel portion 252. As shown in FIG. 7 and FIG. 8, the dividers 253 may not extend to either the end wall 212 or the end wall 222 of the heatsink 200. Generally, the dividers 253 can provide increased surface area for the coolant flow channel 250 to yield increased heat transfer from the first mounting surface 203 and the second mounting surface 204 to the coolant circulating through the coolant flow channel 250.

The coolant flow channel 250 can circulate coolant, such as liquid coolant (e.g., liquid antifreeze), within the inside of the heatsink 200. The coolant flow path formed by the coolant flow channel 250 can run from the coolant input port 381 to the coolant output port 382. Hence, coolant can be received from the coolant input port 381, pass through the coolant flow channel 250, and exit the heatsink 200 via the coolant output port 382. The drain port 387 can be at an intermediate part of the coolant flow path, such as shown in FIG. 6 and FIG. 8. It should also be noted that though coolant input port 381 and coolant output port 382 have been characterized as a coolant inlet and a coolant outlet, respectively, coolant may also be provided to the heatsink 200 in the reverse order.

The coolant flow channel 250 according to embodiments of the disclosed subject matter (even with one or more dividers 253) can define a primary or main coolant flow channel for the coolant. Therefore, the coolant flow channel 250 may be characterized as a single-path coolant flow channel, even though relatively small amounts of coolant may be allowed to bypass the coolant flow channel 250 as discussed below. As shown in FIG. 6, the coolant flow channel 250 can be arranged to define a winding coolant flow path. Such winding can be according to a serpentine or switchback pattern. Thus, the coolant flow channel 250 may define a serpentine coolant flow path.

One or more openings 275 can be provided inside the heatsink 200. FIGS. 6-8, for instance, show three openings 275 at the first end portion 210 of the heatsink 200 and two openings 275 at the second end portion 220 of the heatsink 200. As shown, the openings 275 at the first end portion 210 can be spaced from each other in a width direction of the heatsink 200. Likewise, the openings 275 at the second end portion 220 can be spaced from each other in the width direction of the heatsink 200.

The openings 275 can be formed in channel walls 255 that form the coolant flow channel portions 252 of the coolant flow channel 250. Optionally, the openings 275 can be formed in the channel wall 255 at an end edge of the channel wall 255. Thus, in one or more embodiments, the opening 275 may be defined by the channel wall 255 and either the end wall 212 or the end wall 222, depending upon whether the opening 275 is at the first end portion 210 or the second end portion 220 of the heatsink 200. As an example, each opening 275 may be square in cross-section, though embodiments of the disclosed subject matter are not limited to openings that are square in cross section. In this example, the cross-sectional dimensions can be 3×3 mm.

Each channel wall 255 can separate adjacent flow channel portions 252. Thus, the openings 275 can be between and open (always open) to adjacent flow channel portions 252. According to one or more embodiments, each of the openings 275 can be at a coolant flow turn or corner portion of the coolant flow channel 250, such as shown in FIGS. 6-8. Depending upon the location of the opening 275 in the coolant flow path, the opening 275 may be either at only one coolant flow turn or corner portion or at two coolant flow turn or corner portions of the adjacent flow channel portions 252.

Each opening 275 at the first end portion 210 can be configured or adapted to pass air. Each opening 275 at the second end portion 220 may also be configured or adapted to pass air. Hence, the openings 275 may be referred to as air vents. In this regard, each opening 275 can pass or vent air from one flow channel portion 252 to an adjacent flow channel portion 252. The openings 275 may also be configured or adapted to pass a relatively small amount of the coolant compared to the amount of coolant passing through the adjacent flow channel portions 252 of the coolant flow channel 250.

Figure 9:
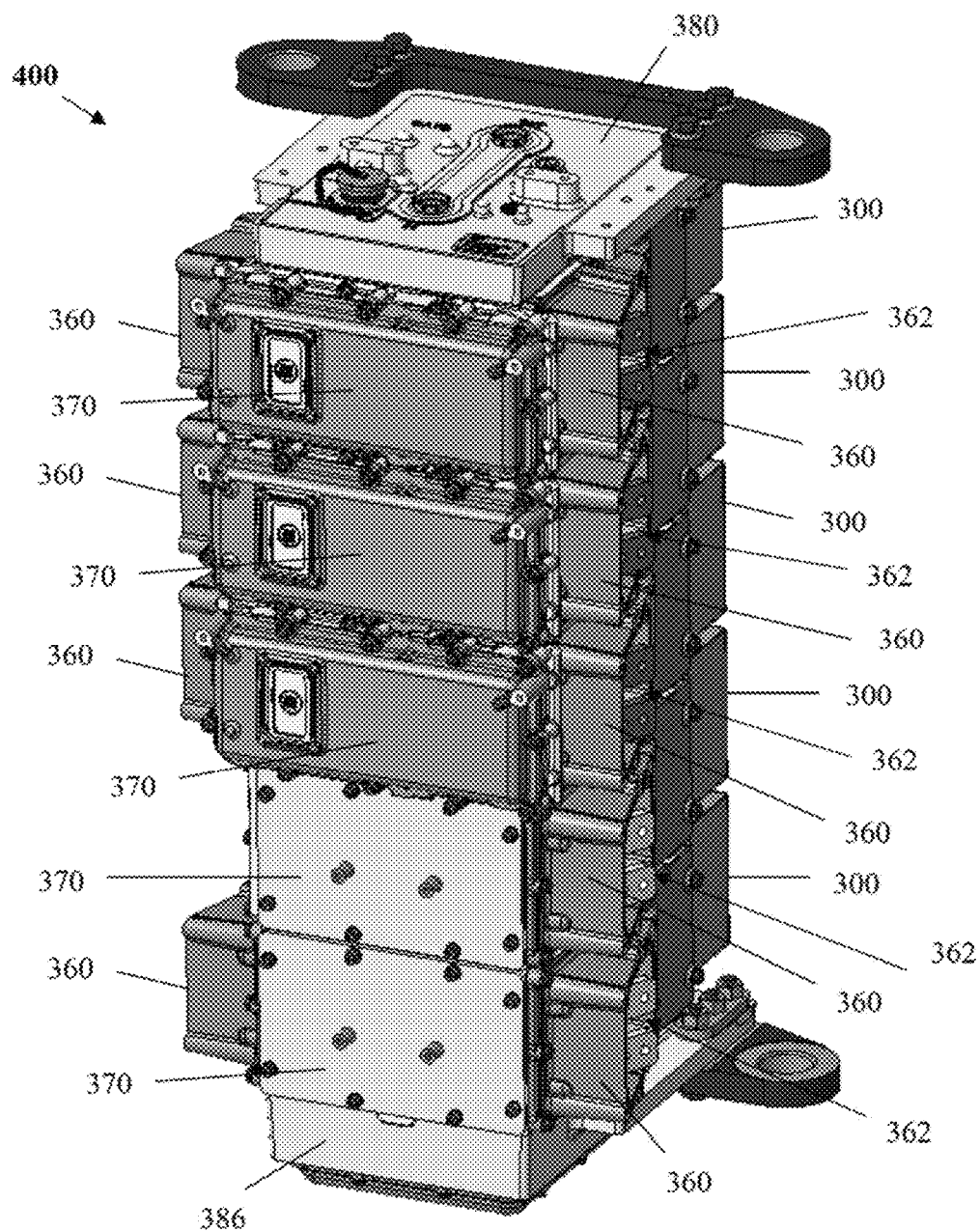
FIG. 9 shows an inverter assembly or arrangement according to one or more embodiments of the disclosed subject matter in a vertical orientation.

FIG. 9 shows an inverter arrangement or assembly 400 according to one or more embodiments of the disclosed subject matter. Inverter assembly 400 can be formed from the cage assembly 410 discussed above for FIG. 4. Moreover, inverter assembly 400 can be representative of inverter assembly 110-15 discussed above with respect to FIG. 2H.

Notably, the inverter assembly 400 can have or otherwise be provided with a plurality of capacitors 300. The capacitors 300 can be mechanically fixed (and optionally sealingly fixed) at a rear side (according to the view of FIG. 9) of the inverter assembly 400 so as to extend or project from the underlying cage assembly 410. According to one or more embodiments, the capacitors 300 can be provided on a per-cage basis. For instance, one or more capacitors 300 can be mechanically fixed (and optionally sealingly fixed) exclusively to a particular one of the cages. Optionally, one capacitor 300 can be provided for each window or opening provided at the rear side of the underlying cage 350.

Electrical connections (e.g., terminals or leads) of the capacitors 300 can extend into the inner volume of their respective cages 350. Thus, according to one or more embodiments of the disclosed subject matter, each capacitor 300 may be electrically provided only for electrical components of the corresponding cage (though embodiments of the disclosed subject matter are not so limited). To be clear, each cage 350 can have more than one capacitor 300 mechanically coupled thereto. Thus, on a per cage basis, each cage 350 can have mechanically fixed thereto only one capacitor 300 or multiple capacitors 300.

In addition to the first end plate 380 and the second end plate 386, the inverter assembly 400 can include a plurality of power connection interface covers or panels 360. The power connection interface panel 360 can include one or more electrical connection terminals or contacts 362. As an example, the electrical connection terminals 362 may be characterized or operative as phase cable connections. Such electrical connection terminals 362 can constitute output terminals 134 of the inverter assembly 400 and can lead to the second power link 114.

The power connection interface covers 360 can be mechanically fixed (and optionally sealingly fixed) to underlying cages 350 of the underlying cage assembly 410 of the inverter assembly 400. According to one or more embodiments, the power connection interface covers 360 can be provided on a per-cage basis per side of the cage assembly 410. Moreover, though the inverter assembly 400 can have cages 350 having the same size, for inverter assemblies having cages of difference sizes, the power connection interface covers 360 can be sized to cover the particular opening for the size of cage.

Optionally, the power connection interface covers 360 can be grouped according to sets. For instance, as shown in FIG. 9, a first set of power connection interface covers 360 can be provided on one side of the inverter assembly 400 (left side in the orientation of FIG. 9) and a second set of power connection interface covers 360 can be provided on another side of the inverter assembly 400 opposite the one side associated with the first set (right side in the orientation of FIG. 9).

The inverter assembly 400 can also include a plurality of panel arrangements 370. The panel arrangements 370 can be mechanically fixed (optionally sealingly fixed) to underlying cages 350 of the cage assembly 410 of the inverter assembly 400. The configuration of the panel arrangements 370, which may be homogenous or heterogenous (such as shown in FIG. 9), can be based on the overall power configuration and/or arrangement of the internal components of the inverter assembly 400. For instance, some or all of the panel arrangements 370 can include a control interface to electronically control operation of the inverter assembly 400. In one or more embodiments, the panel arrangements 370 can be provided on a side of the inverter assembly 400 opposite the capacitors 300, such as shown in FIG. 9. Though the inverter assembly 400 has cages 350 having the same size, for inverter assemblies having cages of difference sizes, the panel arrangements 370 can be sized to cover the particular opening for the size of cage.

As noted above, the arrangement of the capacitor(s) 300, the panel arrangement(s) 370, and the power connection interface cover(s) 360 can be different than as shown in FIG. 9, and may be specific to the particular inverter assembly 110. For instance, according to one or more embodiments the capacitor(s) 300 and the power connection interface cover(s) 360 can be on opposite sides of each cage or each cage assembly, and panel arrangement(s) 370 can be on the remaining opposite sides of each cage or each cage assembly.

INDUSTRIAL APPLICABILITY

As noted above, present disclosure relates to heatsinks for electrical inverters (including converters), and more particularly heatsink configurations and/or orientations as well as systems, components, and methods thereof.

Embodiments of the disclosed subject matter can implement a heatsink or heat exchanger, such as heatsink 200, that can provide relatively simple fill and/or drain processes. Such filling process can be performed without priming or 'burping,' and the draining process can be performed without special draining efforts, such as removing or reorienting the heatsink 200 to drain. One or more openings, such as openings 275, can be provided in the heatsink 200 to vent air from inside the heatsink 200 to outside the heatsink 200. Such venting can prevent or minimize entrapped air in the heatsink 200. The one or more openings 275 can be provided (e.g., sized, positioned, oriented, etc.) to allow the heatsink 200 to properly fill and drain coolant, while minimizing loss in heat transfer performance due to coolant bypassing the primary flow passages (i.e., the flow channel portions 252 of the coolant flow channel 250) during operation. Accordingly, embodiments of the disclosed subject matter can fill the heatsink 200 with coolant via a single fill point, at a suitable fill rate, without or with minimized air lock because of air entrapment within the heatsink 200.

Referring again to FIGS. 6-8, an internal coolant flow path can be defined inside the heatsink 200 by the coolant flow passage or channel 250. The coolant flow channel 250 can be comprised of a plurality of flow channel portions 252, and flow channel turn portions of the coolant flow channel 250 may fluidly link adjacent flow channel portions 252 at the first end portion 210 and the second end portion 220 of the heatsink 200.

The coolant flow channel 250 can circulate coolant, such as liquid coolant (e.g., liquid antifreeze), within the inside of the heatsink 200. The coolant flow path formed by the coolant flow channel 250 can run from the coolant input port 381 to the coolant output port 382. Hence, coolant can be received from the coolant input port 381, pass through the coolant flow channel 250, and exit the heatsink 200 via the coolant output port 382.

One or more openings 275 can be provided inside the heatsink 200. The openings 275 at the first end portion 210 and likewise the second end portion 220 of the heatsink 200 can be spaced from each other in a width direction of the heatsink 200. The openings 275 can be provided in channel walls 255 that separate adjacent flow channel portions 252. The openings 275, therefore, can be between and open (always open) to adjacent flow channel portions 252. The openings 275 can be at respective coolant flow turns or corner portions of the coolant flow channel 250, such as shown in FIGS. 6-8.

Each opening 275 can be configured or adapted to pass air. Hence, the openings 275 may be referred to as air vents. In this regard, each opening 275 can pass or vent air from one flow channel portion 252 to an adjacent flow channel portion 252. The openings 275 can also pass a relatively small amount of the coolant compared to the amount of coolant passing through the adjacent flow channel portions 252 of the coolant flow channel 250. Thus, each opening 275 can pass air and a relatively small amount of coolant from one flow channel portion 252 to the adjacent flow channel portion 252.

The openings 275 can more easily expel air from the heatsink 200, especially when the heatsink 200 is vertically oriented and air may be more difficult to "push" down through the coolant flow channel 250, by routing the air across the channel wall 255 from one flow channel portion 252 to an adjacent flow channel portion 252 further down or subsequent in the coolant flow path. The air may ultimately be expelled via the coolant output port 382. Such venting or expelling of air can be characterized as automatically occurring, since operation of a manual air bleeder or purge valve is not performed (indeed, embodiments of the disclosed subject matter can be without such manual bleeder/valve). Moreover, such venting or expelling air can occur during initial filling and/or after filling in the event that air somehow enters the heatsink 200. Though coolant input port 381 and coolant output port 382 have been characterized as a coolant inlet and a coolant outlet, respectively, coolant may also be provided to the heatsink 200 in the reverse order. That is, the coolant output port 382 can be receive coolant into the heatsink 200 and the coolant input port 381 can output coolant from the heatsink 200 after the coolant circulates through the coolant flow channel 250. Likewise, air may be routed across the openings 275 toward and to the coolant input port 381 and output from the heatsink 200. Hence, the configuration of the openings 275 can allow the coolant flow direction to be switched (i.e., the coolant inlet becomes the coolant outlet and vice versa) without risk of air entrapment.

The heatsink 200 can be filled using respective coolant lines (e.g., hoses) connected to the coolant input port 381 and the coolant output port 382 and with the coolant drain port 387 plugged. Coolant, for instance, pressurized coolant, can be provided to and through the heatsink 200 via the coolant input port 381. Generally, any air in the heatsink 200 can be pushed toward the coolant output port 382 via at least the openings 275 at the first end portion 210 of the heatsink 200. That is, coolant can be filled from one side of the coolant flow channel 250 and air can be pushed out of the other side of the coolant flow channel 250 via the openings 275. When filling the heatsink 200 while oriented vertically (and with the coolant input port 381 and the coolant output port 382 facing up), the openings 275 at the first end portion 210 and the second end portion 220 can allow the heatsink 200 to be suitably filled (e.g., amount, timing, etc.), otherwise sufficiently high pressure may not be available to force the coolant through the entire coolant flow path, for instance, before startup of an associated machine to which the inverter assembly (and heatsink 200) is mounted.

During operation, coolant can flow inside the heatsink 200 according to the coolant flow path as defined by the coolant flow channel 250. The coolant flow path may be considered a main or primary coolant flow path, since some relatively small amount of coolant may flow across adjacent coolant flow channel portions 252 via the openings 275 (which always remain open) and bypass some of the main coolant flow path defined by the longitudinal coolant flow channel portions 252. Such coolant bypassing can occur at the openings 275 at the first end portion 210 and the second end portion 220 of the heatsink 200.

Coolant passing through the openings 275 may not add (or sufficiently add) cooling effect to components on the first mounting surface 203 and/or on the second mounting surface 204 of the heatsink 200. However, the openings 275 can be provided (sized, positioned, oriented, etc.) such that the amount of coolant passing through each of the openings 275 during operation of the heatsink 200 is such that enough coolant still flows through the main coolant flow path to sufficiently cool the components on the first mounting surface 203 and the second mounting surface 204 of the heatsink 200. That is, coolant passing through the main coolant flow path can remove heat so as to maintain the components on the first mounting surface 203 and the second mounting surface 204 of the heatsink 200 below a predetermined temperature or within a predetermined temperature window, even though some coolant may flow through the openings 275 at the first end portion 210 of the heatsink 200 and the second end portion 220 of the heatsink 200 during operation.

For draining, the one or more openings 275 at the second end portion 220 of the heatsink 200 can facilitate flow of the coolant toward and to the coolant drain port 387. That is, coolant can cross over from one flow channel portion 252 to an adjacent flow channel portion 252 toward and to the coolant drain port 387. Providing the opening(s) 275 at the second end portion 220 can fluidly connect all of the flow channel portions 252 at the second end portion 220 of the heatsink 200 and lead to the coolant drain port 387. Such fluid communication provided by the openings 275 at the second end portion 220 of the heatsink 200 can allow the coolant to use gravity to drain effectively. The one or more openings 275 at the first end portion 210 of the heatsink 200 may not pass coolant during the draining process, except perhaps to expel coolant residing in the opening 275 at the beginning of the draining process.

As noted above, the heatsink 200 (and the corresponding inverter assembly 110, 400, 500) can be oriented vertically. Such vertical orientation can be to accommodate space requirements of the particular machine to which the inverter assembly 110, 400, 500 is mounted. For instance, the inverter assembly 110, 400, 500 can be mounted vertically between ripper arms of a tractor. The vertical orientation of the inverter assembly 110, 400, 500 (and the heatsink 200) on the machine can also allow the heatsink 200 to be drained without reorienting on or removing the heatsink 200.

Embodiments of the disclosed subject matter can be in the context of a building block approach based on modular cages (e.g., cages 150, 350, 550) to mix and match such cages and one or more power modules 150 provided in each of the cages to create an inverter assembly (e.g., 110, 400, 500) to configure the inverter assembly according to requisite power and space requirements for a particular application. Mounting orientation of the inverter assembly, i.e., either horizontal or vertical, can be based on mounting space available on the particular working machine (e.g., oriented vertically between two ripper arms of a tractor).

Generally, size and configuration of inverter assemblies according to embodiments of the disclosed subject matter can be based on one or more variables, such as type(s) of electrical load (e.g., electrical machines, such as electric generators or electric motors), total number of electrical loads, number of phases for each electrical load, how much power is needed (e.g., power per phase), overall power classification, etc.

The cages 150, 350, 550 can be configured to couple with a power stage layout of the inverter assembly 110, 400, 500. According to embodiments of the disclosed subject matter, such a configuration can provide power to flow from or to three of six sides or faces of the inverter assembly 110, 400, 500. As discussed above, power can flow from or to the inverter assembly 110, 400, 500 via electrical connection terminals 362 of power connection interface panels 360 mechanically fixed to the respective cages 150, 350, 550 of the cage assemblies 410, 510. Hence, such configuration can provide flexibility to integrate a variety of machine applications with the need for or with minimal need for new components, development, or validation effort.

Figure 10:
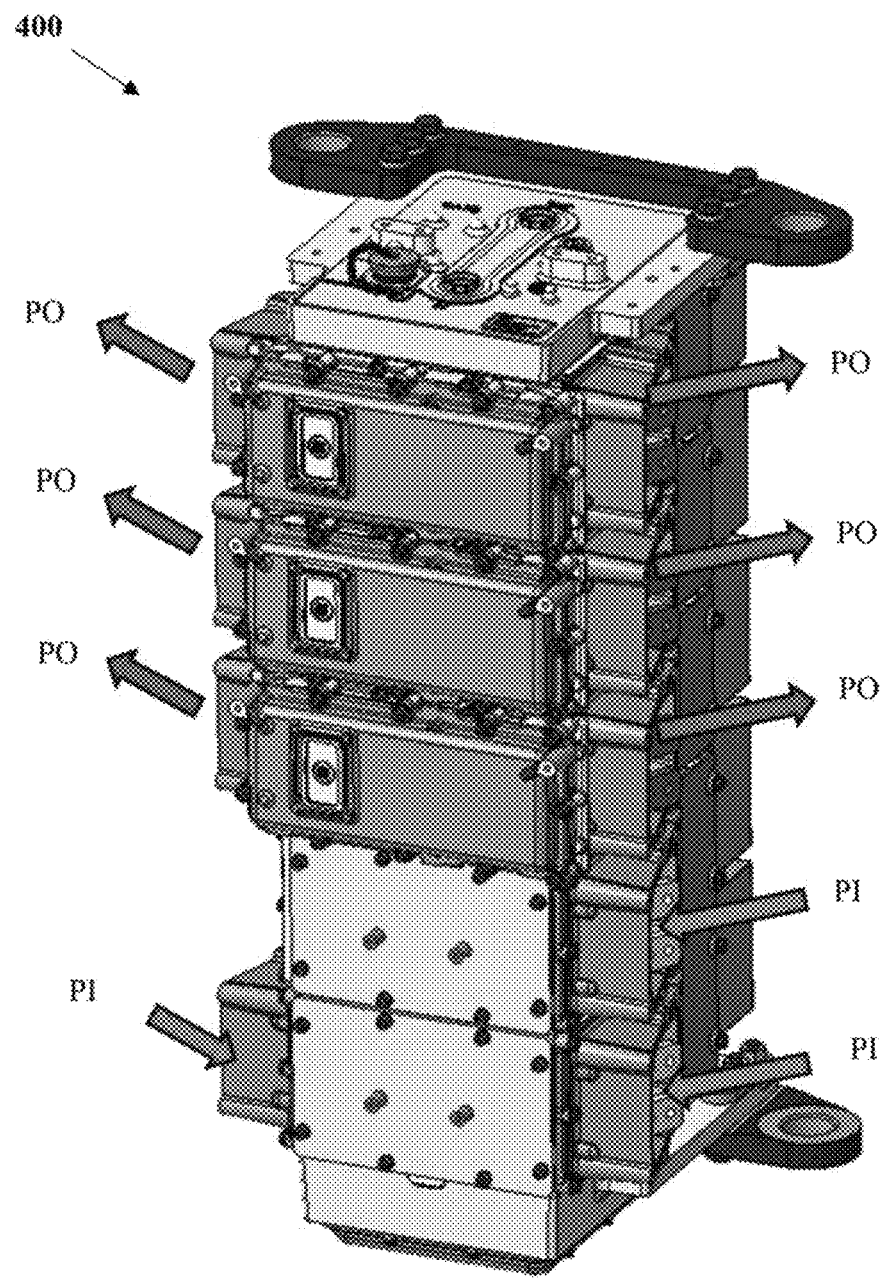
FIG. 10 shows, diagrammatically, exemplary operation of the inverter assembly or arrangement of FIG. 9 according to embodiments of the disclosed subject matter.

FIG. 10 shows, diagrammatically, exemplary operation of the inverter assembly 400. Generally, the arrows represent power being output or provided to the inverter assembly 400.

In this example, the arrows PI represent power coming into the inverter assembly 400 from a power source (e.g., generator, battery(ies), fuel cell(s), electrical grid). Here, the three PI arrows can represent three phases of input power provided to the inverter assembly 400. Therefore, in this example the PI can have associated therewith two cages 350 (i.e., the bottom two in this orientation) and corresponding power modules 170. Note also that though FIG. 10 shows single arrows for PI, the PI may be representative of one or more PI signals per phase, depending upon whether the corresponding power module 170 is the SP power module 170, the DP power module 170, or the TP power module 170.

The PO arrows being output from the left of the inverter assembly 400 can be representative of providing power to a single electrical load, such as a single electric motor. Likewise, the PO arrows being output from the right of the inverter assembly 400 can be representative of providing power to another single electrical load, such as another single electric motor. Alternatively, the electrical load can receive PO signals from both sides of the inverter assembly 400. For instance, the top two PO signals on the left and the top PO signal on the right of the inverter assembly 400 can be provided to one electrical load (e.g., one electric motor), and the remaining PO signals can be provided to another electrical load (e.g., another electric motor). Thus, an electrical load (e.g., an electric motor) can receive power from power modules 170 associated with a single side or both sides of the inverter assembly 400, depending upon the arrangement of the power modules 170 in the inverter assembly 400. Therefore, PO signals for different loads (e.g., electric motors) can be output from common cages 350 according to some embodiments of the disclosed subject matter. Note also that the three PO arrows per electrical load can represent three phases of output power provided to the corresponding electrical load (e.g., a three-phase electric motor). Additionally, though FIG. 10 shows single arrows for each PO, each PO arrow may be representative of one or more PO signals per phase, depending upon whether the corresponding power module 170 is the SP power module 170, the DP power module 170, or the TP power module 170.

The arrangement of the power modules 170 and corresponding power inputs/outputs PI/PO can be to keep connections for a common electrical load (e.g., an electric machine, such as an electric motor or electric generator) relatively close to each other. This can reduce wire routing/harness complexity and/or provide suitable Electromagnetic Compatibility (EMC) for the particular inverter assembly.

While aspects of the present disclosure have been particularly shown and described with reference to the embodiments above, it will be understood by those skilled in the art that various additional embodiments may be contemplated by the modification of the disclosed machines, assemblies, systems, and methods without departing from the spirit and scope of what is disclosed. Such embodiments should be understood to fall within the scope of the present disclosure as determined based upon the claims and any equivalents thereof.

The invention claimed is:

1. An inverter assembly for a power system comprising:
a cage assembly formed of at least two cages fixed to each other side-by-side in a row so as to define a first end of the cage assembly and a second end of the cage assembly opposite the first end; and
a heatsink, having a planar body, extending transversely through an inner volume of each of the at least two cages, from at least the first end of the cage assembly to at least the second end of the cage assembly,
wherein the cage assembly and the planar body of the heatsink are oriented vertically such that the cage assembly extends vertically from the first end to the second end thereof,
wherein the planar body of the heatsink defines an internal coolant flow path adapted to pass coolant received from an inlet port of the heatsink to an outlet port of the heatsink during operation of the heatsink, wherein the coolant flow path is arranged in a serpentine pattern from the inlet port to the outlet port and is formed by a plurality of flow channel portions, wherein one or more vent openings are provided along the coolant flow path at a first end portion of the heatsink and one or more vent openings are provided along the coolant flow path at a second end portion of the heatsink opposite the first end portion, and wherein each of the vent openings is adapted to pass air and a predetermined amount of the coolant from one flow channel portion to an adjacent flow channel portion of the plurality of flow channel portions.

2. The inverter assembly according to claim 1,
wherein the inlet port and the outlet port of the heatsink are provided at the first end portion of the heatsink, and
wherein a drain port of the heatsink is provided at the second end portion of the heatsink.

3. The inverter assembly according to claim 1, wherein each of the one or more vent openings at each of the first end portion and the second end portion of the heat sink is square with a 3×3 mm cross section.

4. The inverter assembly according to claim 1, wherein the one or more vent openings at the first end portion of the heatsink include a plurality of the vent openings, said vent openings at the first end portion being spaced from each other in a width direction of the planar body of the heatsink.

5. The inverter assembly according to claim 1, wherein the one or more vent openings at the second end portion of the heatsink include a plurality of the vent openings, said vent openings at the second end portion being spaced from each other in a width direction of the planar body of the heatsink.

6. The inverter assembly according to claim 1, wherein the predetermined amount of the coolant through each of the vent openings is less than an amount of coolant through each of the adjacent flow channel portions.

7. The inverter assembly according to claim 1, wherein the cage assembly with the heatsink are fixed to a tractor, between ripper arms of the tractor, in the vertical orientation.

8. The inverter assembly according to claim 1, further comprising one or more power modules fixed to a first mounting surface of the heatsink and/or one or more power modules fixed to a second mounting surface of the heatsink opposite the first mounting surface.

9. The inverter assembly according to claim 1, wherein each of the one or more vent openings at the first end portion of the heatsink and each of the one or more vent openings at the second end portion of the heatsink are provided at respective turn portions of the coolant flow path.

* * * * *